United States Patent
Lam et al.

(10) Patent No.: US 11,431,325 B1
(45) Date of Patent: Aug. 30, 2022

(54) RADIATION TOLERANT VOLTAGE FEEDFORWARD MODE PULSE-WIDTH MODULATOR CONTROL

(71) Applicant: Crane Electronics, Inc., Lynnwood, WA (US)

(72) Inventors: Cuon Lam, Renton, WA (US); Ryan Ricchiuti, Edmonds, WA (US); Joseph Alexander, Bothell, WA (US); Sovann Song, Kent, WA (US); Mikel Thomas, Kirkland, WA (US)

(73) Assignee: Crane Electronics, Inc., Redmond, WA (US)

( * ) Notice: Subject to any disclaimer, the term of this patent is extended or adjusted under 35 U.S.C. 154(b) by 0 days.

(21) Appl. No.: 17/393,148

(22) Filed: Aug. 3, 2021

(51) Int. Cl.
| H03K 3/017 | (2006.01) |
| H03K 7/08  | (2006.01) |
| H03K 4/06  | (2006.01) |
| H03K 5/24  | (2006.01) |

(52) U.S. Cl.
CPC ............... *H03K 3/017* (2013.01); *H03K 4/06* (2013.01); *H03K 5/24* (2013.01); *H03K 7/08* (2013.01)

(58) Field of Classification Search
CPC ............ H03K 3/017; H03K 4/06; H03K 5/24; H03K 7/08
USPC .................................................. 327/172, 175
See application file for complete search history.

(56) References Cited

U.S. PATENT DOCUMENTS

| 4,272,690 A * | 6/1981 | Riney ...................... H03K 7/08 327/136 |
| 5,075,634 A * | 12/1991 | French .................. H03F 3/2173 330/146 |
| 5,315,260 A * | 5/1994 | Link ...................... H03K 5/082 327/184 |
| 6,870,329 B2 * | 3/2005 | Krieger ................ H05B 39/047 315/295 |
| 6,977,488 B1 | 12/2005 | Nogawa et al. |
| 7,016,204 B2 | 3/2006 | Yang et al. |
| 7,453,250 B2 | 11/2008 | Qiu et al. |
| 9,325,233 B2 | 4/2016 | Bennett et al. |
| 2006/0233232 A1 * | 10/2006 | He ........................... H03K 7/08 375/238 |

* cited by examiner

*Primary Examiner* — William Hernandez
(74) *Attorney, Agent, or Firm* — Seed IP Law Group LLP

(57) ABSTRACT

A pulse-width modulation circuit includes an oscillator stage. The oscillator stage includes a first voltage comparator having a first input terminal, a second input terminal and an output terminal. A first capacitor is coupled to the first input terminal of the first voltage comparator. A charging path for the first capacitor is coupled between the first capacitor and the output terminal of the first voltage comparator, the charging path having a first resistance. A discharging path for the first capacitor is coupled between the first capacitor and the output terminal of the first voltage comparator, the discharging path having a second resistance that is different from the first resistance. A duty cycle of a clock signal generated by the oscillator stage is determined based on a first RC time constant for charging the first capacitor and a second RC time constant for discharging the first capacitor.

21 Claims, 5 Drawing Sheets

US 11,431,325 B1

RADIATION TOLERANT VOLTAGE FEEDFORWARD MODE PULSE-WIDTH MODULATOR CONTROL

BACKGROUND

Technical Field

The present disclosure generally relates to controllers for power converters.

Description of the Related Art

DC/DC converters are a type of power supply which converts an input DC voltage to a different output DC voltage. Such converters typically include a transformer that is electrically coupled via a switching circuit between a voltage source and a load. Converters known as forward converters include at least one main switch connected between the voltage source and the primary winding of the transformer to provide forward power transfer to the secondary winding of the transformer when the switch is on and conducting. The converter switches are typically operated in closed loop fashion through pulse width modulation (PWM) for voltage mode control with the PWM duty cycle being adjusted according to an output Voltage feedback signal. A metal oxide semiconductor field effect transistor (MOSFET) device is typically used for the one or more main switches.

Power converter designs are often constrained by various requirements, such as efficiency, input voltage range, output voltage, power density, and footprint area. These constraints require certain performance tradeoffs. For instance, achieving higher efficiencies may require a more narrow input voltage range. To further improve efficiencies, active-reset schemes and synchronous rectifications are often employed. These synchronous rectification schemes can either be active-control or self-driven.

Environments with high levels of ionizing radiation create special design challenges. A single charged particle can knock thousands of electrons loose, causing electronic noise and signal spikes. In the case of digital circuits, this can cause results which are inaccurate or unintelligible. This can be a particularly serious problem in the design of components for satellites, spacecraft, aircraft, power stations, etc.

BRIEF SUMMARY

A pulse-width modulation circuit includes an oscillator stage. The oscillator stage includes a first voltage comparator having a first input terminal, a second input terminal and an output terminal. A first capacitor is coupled to the first input terminal of the first voltage comparator. A charging path for the first capacitor is coupled between the first capacitor and the output terminal of the first voltage comparator, the charging path having a first resistance. A discharging path for the first capacitor is coupled between the first capacitor and the output terminal of the first voltage comparator, the discharging path having a second resistance that is different from the first resistance. A duty cycle of a clock signal generated by the oscillator stage is determined based on an RC time constant for charging the first capacitor and an RC time constant for discharging the first capacitor.

The pulse-width modulation circuit also includes a ramping stage. The ramping stage includes a second capacitor coupled to a voltage source through a resistor. The second capacitor is coupled to the output terminal of the first voltage comparator of the oscillator stage through a first diode, with a cathode terminal of the first diode coupled to the output terminal of the first voltage comparator. When a voltage signal at the output terminal of the first voltage comparator is at a high voltage level, the second capacitor is charged by the voltage source through the resistor. When the voltage signal at the output terminal of the first voltage comparator is at a low voltage level, the second capacitor is discharged through the first diode. The discharging of the second capacitor is much faster than the charging the second capacitor such that a voltage potential of the second capacitor has a waveform shape of a saw-tooth.

The pulse-width modulation circuit also includes an output stage. The output stage includes a second voltage comparator having a first input terminal, a second input terminal, and an output terminal. The first input terminal of the second voltage comparator is coupled to the second capacitor of the ramping stage. The second input terminal of the second comparator is coupled to a control signal. The output terminal of the second voltage comparator is coupled to an output circuitry. The output circuitry is configured to output a pulse-width modulated voltage signal based on a voltage signal at the output terminal of the second voltage comparator and a voltage signal at the output terminal of the first voltage comparator.

Advantageously, one or more implementations discussed herein achieve pulse-width modulation control through the use of discrete or analog devices and minimal integrated circuits. This provides full control and ownership of the design, and selection of parts that allows for a wide variety of configurations, including configurations that provide various output power ranges and various levels of radiation hardness.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with circuits have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Figure 1:
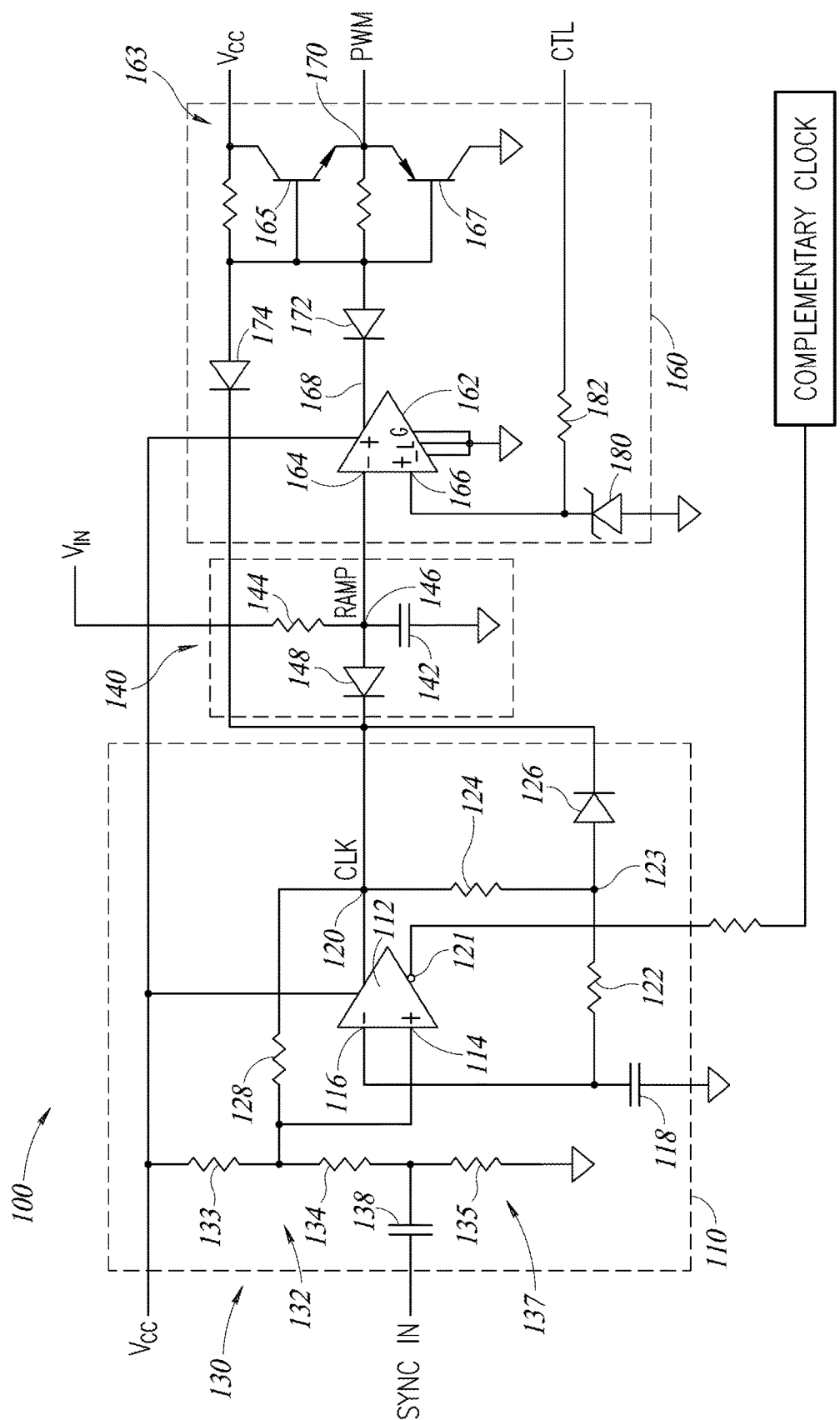
FIG. 1 is an example circuit diagram according to an illustrated implementation.

One or more implementations of the present disclosure provide pulse-width modulator (PWM) controller circuitry for power converters using discrete analog components. FIG. 1 shows a schematic diagram for a PWM controller circuitry 100 according to example implementations of the present disclosure. In the illustrated implementation, the PWM controller circuitry 100 includes an oscillator stage 110, a ramping stage 140, and a PWM generation stage 160.

In one or more implementations, the oscillator stage 110 includes a voltage comparator 112. A first differential input terminal 114, e.g., positive input terminal, of the comparator 112 is coupled to receive a threshold input signal, and a second differential input terminal 116 of the voltage comparator 112 is coupled to a capacitor 118. The capacitor 118 is coupled to a first output terminal 120 of the voltage comparator 112 through a resistor 122 in series with one of a resistor 124 or a diode 126. Specifically, the resistor 124 and the diode 126 are coupled in parallel between the first output terminal 120 and an interconnection node 123. The resistor 122 is coupled between the interconnection node 123 and the capacitor 118. As shown in FIG. 1, the cathode of the diode 126 is coupled to the first output terminal 120. The first differential input terminal 114 is coupled to the first output terminal 120 through a resistor 128.

Figure 2A:
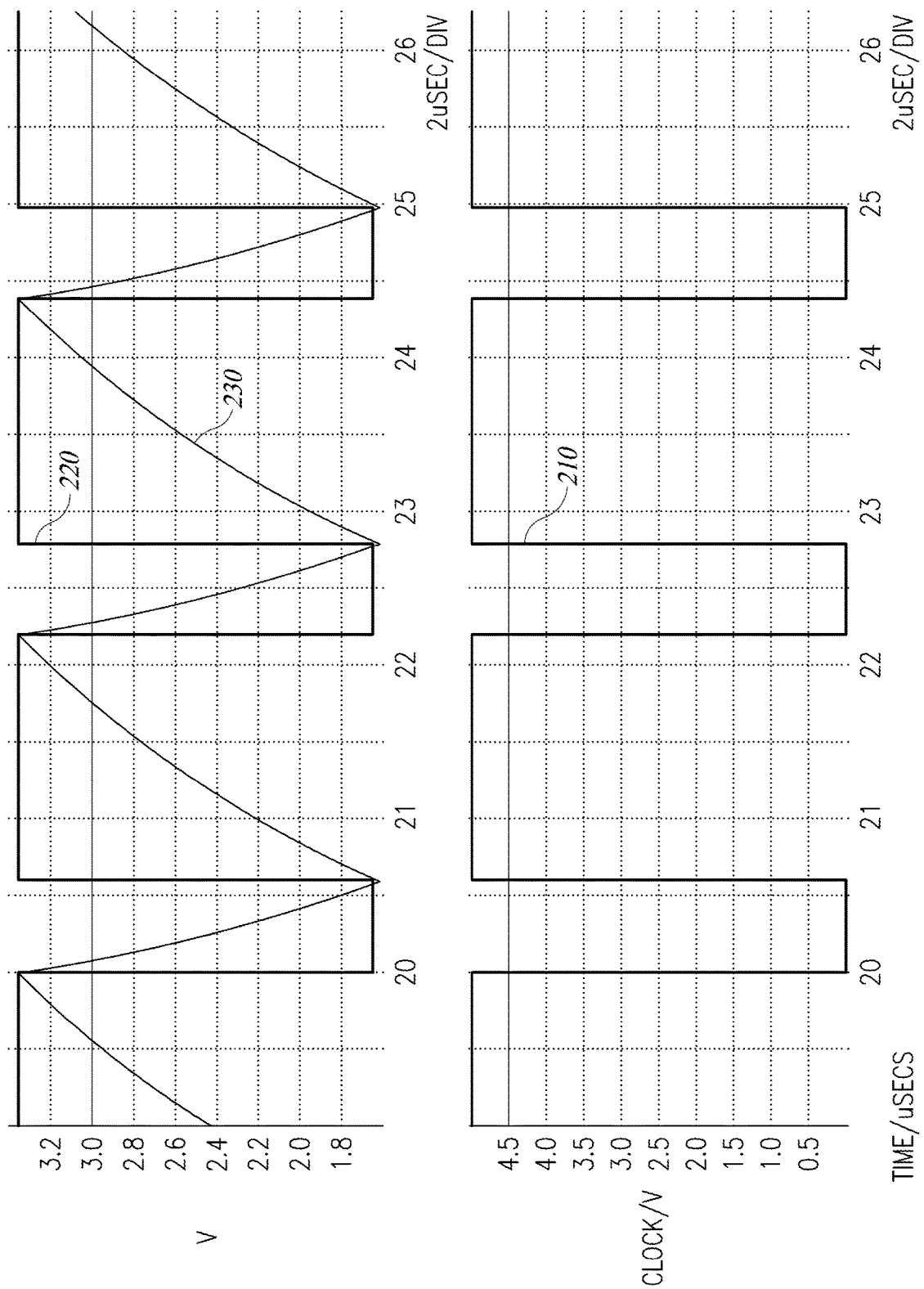
FIG. 2A shows example signal waveforms according to some illustrated operations of the example circuit of FIG. 1.

In some implementations, the capacitance value of the capacitor 118 and the resistance values of the resistor 122 and the resistor 124 are selected to set up the duty cycle of the output signal at the first output terminal 120, e.g., a clock signal (CLK). Referring also to FIG. 2A, which shows example waveform diagrams of a clock signal 210 at the first output terminal 120, a first input signal 220 at the first differential input terminal 114 and a second input signal 230, i.e., the voltage value of the capacitor 118, at the second differential input terminal 116. Through the feedback paths, both the first input signal 220 and the second input signal 230 are affected by the voltage value at the first output terminal 120. For example, when the clock signal 210 is at a logic high value at the first output terminal 120, e.g., approximately the value of the voltage source Vcc, the capacitor 118 is charged by the voltage at the first output terminal 120 through the resistor 122 and the resistor 124, shown as the sloped rising edge of the second input signal 230. The RC time constant required to charge the capacitor 118 is determined by the combined resistance of the resistor 122 and the resistor 124, e.g., (R1+R2)*C, where R1 is the resistance value of the resistor 122, R2 is the resistance value of the resistor 124, and C is the capacitance value of the capacitor 118. When the capacitor 118 is charged to a voltage level that meets the threshold voltage at the first differential input terminal 114, e.g., equal to or greater than the threshold voltage at the first differential different input terminal 114, the output of the comparator 112, e.g., the clock signal 210, switches to a low logic value. Due to the feedback path through the resistor 128, the first input signal 220 at the first differential input terminal 114 changes to a low threshold value. Also, in response to the low voltage value of the clock signal 210 at the first output terminal 120, the capacitor 118 discharges through the first resistor 122 and the diode 126, shown as the sloped falling edge of the second input signal 230. The RC time constant required to discharge the capacitor 118 is smaller than the RC time constant required to charge the capacitor 118 because the capacitor 118 is discharged through only the resistor 122 with a RC time constant of R1*C. When the voltage value of the capacitor 118 is discharged to a level that meets the low threshold voltage at the first differential input terminal 114, e.g., smaller or equal to the low voltage value of the first input signal 220 at the first differential input terminal 114, the clock signal 210 at the first output terminal 120 switches to the logic high value. As such, the duty cycle of the clock signal 210 at the first output terminal 120 is determined based on the ratio between the RC time constant for charging the capacitor 118 and the RC time constant for discharging the capacitor 118. For example, when the resistance value of the resistor 124 increases, the RC time constant for charging the capacitor 118 increases, while the RC time constant for discharging the capacitor 118 stays the same. Resultantly, the duty cycle of the clock signal 210 at the first output terminal 120 increases. When the resistance value of the resistor 124 decreases, the RC time constant for charging the capacitor 118 decreases, while the RC time constant for discharging the capacitor 118 stays the same. Resultantly, the duty cycle of the clock signal 210 at the first output terminal 120 decreases.

In the example implementations shown in FIG. 1, the charging path of the capacitor 118 includes greater resistance value than the discharging path. As such, the duty cycle of the clock signal 210 at the first output terminal 120 is larger than 50%. In other implementations, the charging path of the capacitor 118 includes smaller resistance value than the discharging path, and the duty cycle of the clock signal is smaller than 50%. For example, the diode 126 may be coupled between the first output terminal 120 and the first resistor 122 in a direction opposite to that shown in FIG. 1, e.g., anode terminal of diode 126 coupled to the first output terminal 120 of the comparator 112. In this configuration, the capacitor 118 is then charged through the diode 126 and the resistor 122 and discharged through the resistor 122 and the resistor 124.

In some implementations, the input to the first differential input terminal 114 is provided by a voltage input stage 130. The input stage 130 provides an input voltage to the first differential input 114 through a voltage divider circuitry 132. The voltage divider circuitry 132 includes a resistor 133 coupled between the first differential input terminal 114 and a positive voltage Vcc, and resistors 134, 135 coupled in series between the first differential input terminal 114 and a ground. The third resistor 128 feedbacks the output value at the first output terminal 120 of the first comparator 112 by changing the divide-down ratio of the voltage divider circuitry 132. Specifically, when the clock signal 210 at the first output terminal 120 is at the low logic value, e.g., ground value, the resistor 128 is essentially coupled between the first differential input terminal 114 and the ground and in parallel with the resistors 134 and 135. The first voltage input 220 at the first differential input terminal 114 equals to:

$$\frac{Vcc*(R128\|(R134+R135))}{R133+(R128\|(R134+R135))}$$

where R128, R133, R134, R135 are resistance of resistors 128, 133, 134, 135, respectively. Resultantly, a lower voltage is provided to the first differential input 114. As an illustrative example, assume that the resistor 133 is 10K Ω, the resistor 134 is 9K Ω, the resistor 135 is 1K Ω, and the resistor 128 is 10K Ω. When the clock signal 210 is in the low logic value, e.g., ground, the first voltage input 220 to the first differential input terminal 114 will be Vcc*(10 k∥10 k)/(10 k+10 k∥10 k)=⅓ of Vcc. When the clock signal 210 at the first output terminal 120 is at the high logic value, e.g., Vcc, the resistor 128 is essentially coupled between the first differential input terminal 114 and the positive voltage source Vcc, and in parallel with the resistor 133. Resultantly, a higher voltage is provided to the first differential input terminal 114. Following the illustrative example that resistor 133 is 10K Ω, the resistor 134 is 9K Ω, the resistor 135 is 1K Ω, and the resistor 128 is 10K Ω, when the clock signal 210 is in the high logic value, the first voltage input 220 to the first differential input terminal 114 will be Vcc*(10 k)/(10 k+10 k∥10 k)=⅔ of Vcc.

In some embodiments, the input stage 130 also includes a synchronization input signal SYNC IN and an AC coupling unit 137 that includes a capacitor 138 and the resistor 135 coupled between the synchronization input SYNC IN and the first differential input terminal 114. The output of the AC coupling unit 137 is added to the first differential input 114 terminal through the voltage divider 132. The voltage step at the SYNC IN terminal will be exactly the same as the voltage step across the resistor 135. For example, if signal SYNC IN rises by 3V, the instantaneous voltage change across the resistor 135 should be 3V. When the logic value of the clock signal 210 at the first output terminal 120 is at the high logic value, from the voltage across resistor 135 to the first differential input terminal 114, there is a voltage divider equal to (R133∥R128)/(R134+(R133∥R128)). For example, using the illustrative example of resistance values and a SYNC IN step voltage of 3V, the contribution of the SYNC IN signal at the first differential input terminal 114 will be: 3V*(10 k∥10 k)/(9 k+10 k∥10 k)=3V*(5 k/(9 k+5 k))=3V*0.357=1.07V.

Figure 2B:
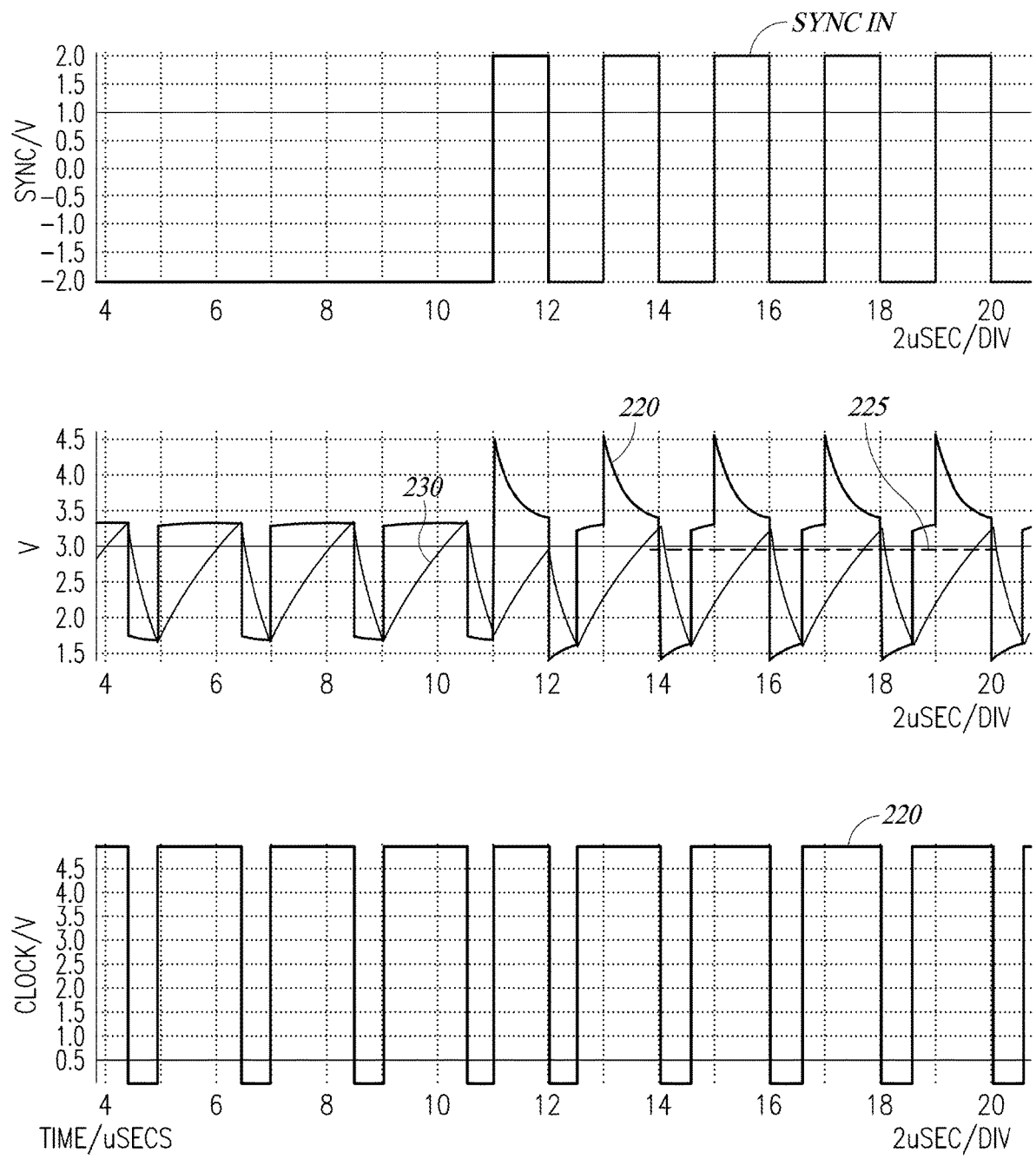
FIG. 2B shows example signal waveforms according to some illustrated operations of the example circuit of FIG. 1.

FIG. 2B shows the influence of the SYNC IN signal on the first input signal 220 and the clock signal 210. Referring to FIG. 2B and FIG. 1 together, when SYNC IN signal is not applied, the first input signal 220 at the first differential input terminal 114 is basically a square wave as similarly shown in FIG. 2A, which acts as a threshold voltage 220. The second input signal 230 at the second differential input terminal 116 is an RC rise or decay of the capacitor 118 towards that threshold voltage. When the SYNC IN signal is applied, the AC coupling by the capacitor 138 forces the first input signal 220 at the first differential input terminal 114, e.g., the threshold voltage, up or down at the rising edge or the falling edge of the SYNC IN signal. After the rising edge or the falling edge of the SYNC input signal, the capacitor 138 resets through the resistor 135. In some embodiments, the resistor 135 is selected to have a smaller resistance value such that the capacitor 138 resets relatively quickly. On the falling edge of SYNC IN, because of the AC coupling effect by the capacitor 138, the voltage value of the first input signal 220 at the first differential input terminal 114, i.e., the threshold voltage, immediately decreases to a level 225 that is below the charged potential of the capacitor 118, which forces the rising voltage 230 at the second differential input terminal 116 to immediately reach the decreased voltage threshold. Resultantly, the clock signal 210 at the first output terminal 120 immediately switches to the low logic value. Therefore, the frequency of the clock signal 210 at the first output terminal 120 of the comparator 112 aligns with the frequency of the synchronization signal SYNC IN.

In some embodiments, the duty cycle of the SYNC IN signal and the clock signal 210, e.g., the RC time constants of the charging and discharging of the capacitor 118, are selected such that at the rising edge of the SYNC IN signal, the clock signal 210 at the first output terminal 120 is already switched to the high logic value and the voltage value of the first input signal 220 at the first differential input terminal 114 is already at the high threshold value. As such, the rising edge of the synchronization signal SYNC IN does not affect the switching of the comparator 112. To this extent, the duty cycle of the SYNC IN signal is selected to be much smaller than that of the clock signal 210 at the first output terminal 120 to ensure that the rising edge of the SYNC IN signal does not affect the switching of the comparator 112, and thus the clock signal 210. The clock signal 210 at the first output terminal 120 of the comparator 112 is synchronized with the falling edge of the SYNC IN signal. As a result, the duty cycle of the clock signal 210 can be maintained to be similar to the designed duty cycle based on the RC time constants of charging and discharging the capacitor 118 as described herein. In some implementations, the duty cycle of the SYNC IN signal is in a range of 20%-50%. In some implementations, the duty cycle of the SYNC IN signal is 50%.

The value of the resistor 134 is selected to allow the injected SYNC IN signal to be divided down so as to configure the amplitude of the influence of the SYNC IN signal at the first differential input terminal 114. Resistor 135 provides a low impedance to allow the AC coupling of the capacitor 138 to reset relatively quickly.

Referring back to FIG. 1, the ramping stage 140 includes a capacitor 142 coupled between a ramp node 146 and a ground. A resistor 144 is coupled between the capacitor 142 and the voltage source Vin. The ramp node 146 (RAMP) between the capacitor 142 and the resistor 144 is coupled to the first output terminal 120 of the oscillator stage 110 through a diode 148. For example, cathode terminal of the diode 148 is coupled to the first output terminal 120.

Figure 3A:
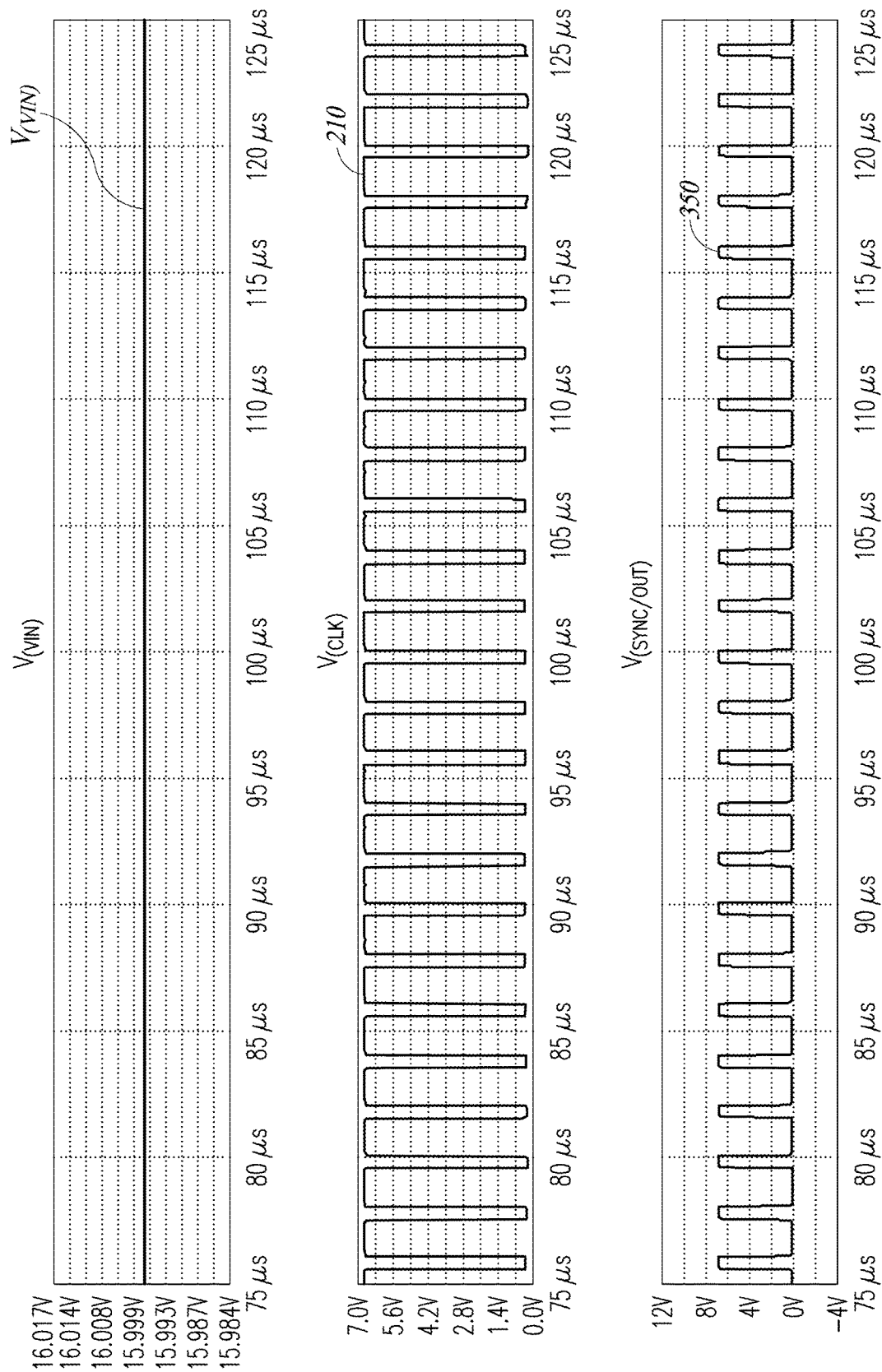
FIGS. 3A and 3B show example signal waveforms according to some illustrated operations of the example circuit of FIG. 1.
Figure 3B:
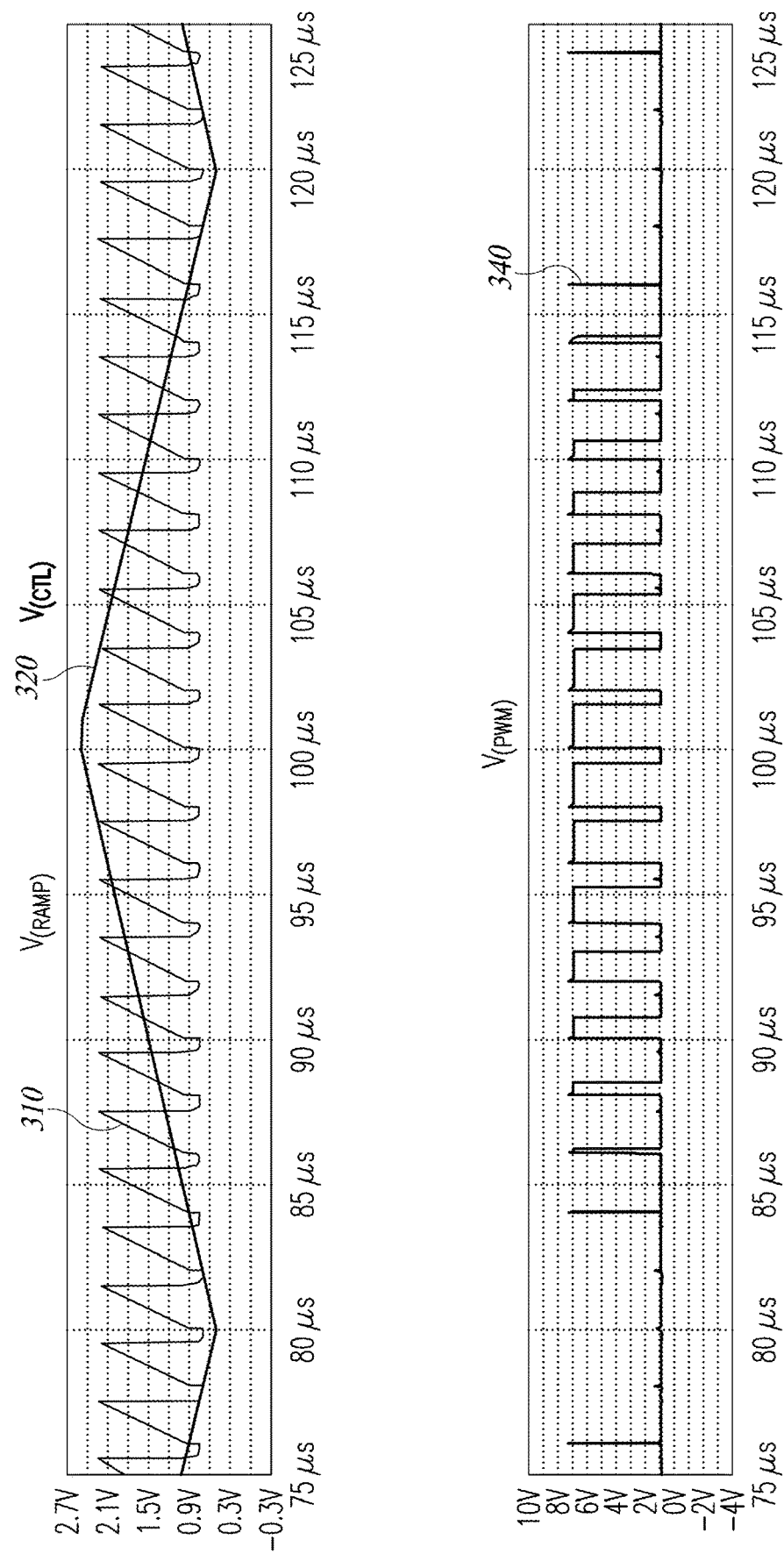

In operation, with reference to FIGS. 1, 3A and 3B together, when the clock signal 210 is at logic high value, the ramp node 146 is separated from the first output terminal 120 by the diode 148. The capacitor 142 is charged by the voltage source Vin through the resistor 144, which is shown as the sloped rising edge of the ramp signal 310 at the ramp node 146. When the clock signal 210 switches to the logic low value, the capacitor 142 discharges very quickly through the diode 148 because there is little resistance in the discharging path, which is shown as the straight falling edge of the ramp signal 310. Resultantly, the ramp signal 310 at the ramp node 146 has a saw-tooth shape.

Referring back to FIG. 1, the PWM generation stage 160 includes a comparator 162 and an output circuitry 163 coupled to a pulse width modulated signal output terminal 170 (PWM). The ramp signal 310 is coupled to a first differential input 164, e.g., a negative input, of the comparator 162. A control signal terminal CTL is coupled to a second differential input terminal 166, e.g., a positive input, of the comparator 162. The output circuitry 163 includes an NPN bipolar junction transistor (BJT) 165 and a PNP BJT 167. The PWM output terminal 170 is coupled to the emitter terminals of the NPN BJT 165 and the PNP BJT 167. The base terminals of the NPN BJT 165 and the PNP BJT 167 are coupled to the output terminal 168 of the comparator 162 through a diode 172 and are coupled to the first output terminal 120 of the comparator 112 through a diode 174. For example, the cathode terminal of the diode 172 is coupled to the output terminal 168, and the cathode terminal of the diode 174 is coupled to the first output terminal 120 of the first comparator 112. In some implementations, the diode 172 may include two or more diodes coupled in series.

In some implementations, the PWM generation stage 160 includes a Zener diode 180 and a resistor 182. The Zener diode 180 is coupled between the control terminal CTL and the ground. The resistor 182 is coupled between the control terminal CTL and the second differential input terminal 166 of the comparator 162. The Zener diode 180 is used to stabilize the voltage input to the second differential input terminal 166 of the comparator 162. For example, the Zener diode 180 may be used to limit the maximum duty cycle of the PWM output if the control of the PWM output servoloop is lost. The Zener diode 180 is used as an illustrative example, other types of diode, e.g., an avalanche diode may also be used or other circuitry mechanisms may also be used to stabilize the voltage input at the second differential input terminal 166.

Referring to FIGS. 1, 3A and 3B together, in operation, when the control signal 320 is greater than the ramp signal 310 in amplitude, the comparator 162 outputs a logic high value at the output terminal 168. The base terminals of the NPN BJT 165 and the PNP BJT 167 are separated from the output terminal 168 of the comparator 162 by the diode 172. When the clock signal 210 at the first output terminal 120 of the comparator 112 is at the high logic value, the base terminals of the NPN BJT 165 and the PNP BJT 167 are separated from the first output terminal 120 of the first comparator 112 by the diode 174. As such, in response to both the clock signal 210 being at the logic high value and the control signal 320 being greater than the ramp signal 310, the PNP BJT 167 is turned off and the NPN BJT 165 is turned on by the positive voltage source Vcc, which drives the voltage at the output terminal PWM, i.e., the PWM signal 340, toward the logic high value of Vcc.

When the control signal 320 is smaller than the ramp signal 310, the comparator 162 outputs a logic low value at the output terminal 168. The bases of the NPN BJT 165 and the PNP BJT 167 are dragged to the low logic value of the output terminal 168 through the diode 172. Further, when the clock signal 210 is at the logic low value, the bases of the NPN BJT 165 and the PNP BJT 167 are dragged to the low logic value of clock signal 210 at the first output terminal 120 through the diode 174. In either or both scenarios, the NPN BJT 165 is turned off and the PNP BJT 167 is turned on, which drives the voltage at the PWM output terminal 170, the PWM signal 340, toward the logic low value. As such, the PWM signal 340 at the PWM output terminal 170 is at a logic high value when the clock signal 210 is at logic high value and the control signal is greater than the ramp signal. When at least one of the clock signal 210 is at the low logic value or the control signal 320 is smaller than the ramp signal 310, the PWM signal 340 is at the logic low value. As such, the pulse width of the PWM signal 340 is modulated by the control signal 320 and the clock signal 210.

In some embodiments, the comparator 112 of the oscillator stage 110 also includes a second output terminal 121 that outputs a clock signal 350 that is complementary to the clock signal at the first output terminal 120. As shown in FIGS. 3A and 3B, the complementary clock signal 350 has a same amplitude as the clock signal 210 and an inverted phase.

Advantageously, one or more implementations discussed herein achieve pulse-width modulation through the use of analog devices and minimal integrated circuits. This provides full control and ownership of the design, and selection of parts that allows for a wide variety of configurations, including configurations that provide various output power ranges and various levels of radiation hardness.

For example, the discrete devices, capacitors, resistors, diodes, and transistors used in the capacitors are selected to be inherently radiation tolerant, e.g., tolerant of Total Ionizing Dose (TID) and Single Event Effects (SEE). For example, the transistors used in the comparators are based on wide-bandgap semiconductor materials like gallium nitride or silicon carbide.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers, as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A pulse-width modulation circuit comprising an oscillator stage, the oscillator stage including:
   a first voltage comparator having a first input terminal, a second input terminal and an output terminal;
   a first capacitor coupled to the first input terminal of the first voltage comparator;
   a charging path coupled between the first capacitor and the output terminal of the first voltage comparator, the charging path having a first resistance;
   a discharging path coupled between the first capacitor and the output terminal of the first voltage comparator, the discharging path having a second resistance that is different from the first resistance; and
   a feedback path between the output terminal of the first voltage comparator and the second input terminal of the first voltage comparator.

2. The circuit of claim 1 wherein the first resistance of the charging path includes a first resistor and a second resistor coupled in series, and the second resistance of the discharging path includes the first resistor coupled in series with a first diode, wherein a cathode terminal of the first diode is coupled to the output terminal of the first voltage comparator.

3. The circuit of claim 1 wherein the feedback path includes a third resistance.

4. The circuit of claim 3, further comprising a resistive voltage divider coupled to the second input terminal of the first voltage comparator, the resistive voltage divider including the third resistance, wherein the third resistance is coupled to vary a divide-down ratio of the resistive voltage divider based on a voltage value at the output terminal of the first voltage comparator.

5. The circuit of claim 1, further comprising an AC coupling unit coupled between a synchronization signal terminal and the second input terminal of the first voltage comparator.

6. The circuit of claim 1, further comprising a ramping stage, the ramping stage including a second capacitor coupled to a voltage source terminal through a fourth resistor and coupled to the output terminal of the first voltage comparator through a second diode, wherein a cathode terminal of the second diode is coupled to the output terminal of the first voltage comparator.

7. The circuit of claim 6, further comprising an output stage coupled to the ramping stage, the output stage including a second voltage comparator having a first input terminal and a second input terminal, the first input terminal of the second voltage comparator coupled to the second capacitor, and the second input terminal of the second voltage comparator coupled to a control signal terminal.

8. The circuit of claim 7 wherein the output stage includes an output circuitry configured to output a pulse-width modulated voltage signal based on a voltage output of the second voltage comparator and a voltage output of the first voltage comparator.

9. The circuit of claim 8 wherein the output circuitry includes an NPN bipolar junction transistor and a PNP bipolar junction transistor, wherein base terminals of the NPN bipolar junction transistor and the PNP bipolar junction transistor are coupled to an output terminal of the second voltage comparator through a third diode, wherein a cathode terminal of the third diode is coupled directly to the output terminal of the second voltage comparator.

10. The circuit of claim 8 wherein the output circuitry is configured to output a first voltage value in response to both the voltage output of the second voltage comparator and the voltage output of the first voltage comparator being at a high logic value; and
   the output circuitry is configured to output a second voltage value in response to at least one of the voltage output of the second voltage comparator or the voltage output of the first voltage comparator being at a low logic value.

11. A pulse-width modulation circuit comprising a ramping stage, the ramping stage including:
   a first capacitor coupled to a voltage terminal through a first resistor; and
   a first diode coupled between the first capacitor and a clock signal node of a clock generation circuitry, a cathode of the first diode being coupled to the clock signal node,
   wherein the clock generation circuitry includes:
      a first voltage comparator having a first input terminal, a second input terminal and an output terminal; and
      a second capacitor coupled to the first input terminal of the first voltage comparator, the second capacitor configured to provide a voltage signal of a saw-tooth waveform shape to the first input terminal based on an output voltage signal of the first voltage comparator.

12. The circuit of claim 11 wherein the clock generation circuitry includes:
   a charging path coupled between the second capacitor and the output terminal of the first voltage comparator, the charging path having a first resistance; and
   a discharging path coupled between the second capacitor and the output terminal of the first voltage comparator, the discharging path having a second resistance that is different from the first resistance.

13. The circuit of claim 12 wherein the clock generation circuitry includes:
   a second resistor coupled between the second capacitor and a first node; and
   a third resistor and a second diode coupled in parallel between the first node and the output terminal of the first voltage comparator,
   wherein the first resistance includes the second resistor and the third resistor in series and the second resistance includes the second resistor.

14. The circuit of claim 13 wherein a cathode of the second diode is coupled to the output terminal of the first voltage comparator.

15. A pulse-width modulation circuit comprising an output stage, the output stage including:
   a first voltage comparator having a first input terminal, a second input terminal, and an output terminal; and
   output circuitry coupled to the output terminal of the first voltage comparator, the output circuitry configured to output a pulse-width modulated voltage signal based on a signal at the output terminal of the first voltage comparator and a clock signal,
   wherein the output circuitry includes an NPN bipolar junction transistor and a PNP bipolar junction transistor, base terminals of the NPN bipolar junction transistor and the PNP bipolar junction transistor are coupled to the output terminal of the first voltage comparator through a first diode, and a cathode terminal of the first diode is coupled to the output terminal of the first voltage comparator.

16. The circuit of claim 15 wherein:
the output circuitry is configured to output a first voltage value in response to both the signal at the output terminal of the first voltage comparator and the clock signal being in a high logic value; and
the output circuitry is configured to output a second voltage value in response to at least one of the signal at the output terminal of the first voltage comparator or the clock signal being in a low logic value.

17. The circuit of claim 15 wherein the first input terminal of the first voltage comparator is configured to receive a first input signal of a waveform of a saw-tooth shape, the first input signal in a sloped rising edge in response to the clock signal being in a logic high value and the first input signal in a falling edge in response to the clock signal being in a logic low value.

18. A pulse-width modulation circuit comprising an output stage, the output stage including:
a first voltage comparator having a first input terminal, a second input terminal, and an output terminal; and
output circuitry coupled to the output terminal of the first voltage comparator, the output circuitry configured to output a pulse-width modulated voltage signal based on a signal at the output terminal of the first voltage comparator and a clock signal,
wherein:
the output circuitry is configured to output a first voltage value in response to both the signal at the output terminal of the first voltage comparator and the clock signal being in a high logic value; and
the output circuitry is configured to output a second voltage value in response to at least one of the signal at the output terminal of the first voltage comparator or the clock signal being in a low logic value.

19. The circuit of claim 18 wherein the first input terminal of the first voltage comparator is configured to receive a first input signal of a waveform of a saw-tooth shape, the first input signal in a sloped rising edge in response to the clock signal being in a logic high value and the first input signal in a falling edge in response to the clock signal being in a logic low value.

20. A pulse-width modulation circuit comprising an oscillator stage, the oscillator stage including:
a first voltage comparator having a first input terminal, a second input terminal and an output terminal;
a first capacitor coupled to the first input terminal of the first voltage comparator;
a charging path coupled between the first capacitor and the output terminal of the first voltage comparator, the charging path having a first resistance; and
a discharging path coupled between the first capacitor and the output terminal of the first voltage comparator, the discharging path having a second resistance that is different from the first resistance,
wherein the first resistance of the charging path includes a first resistor and a second resistor coupled in series, and the second resistance of the discharging path includes the first resistor coupled in series with a first diode, a cathode terminal of the first diode coupled to the output terminal of the first voltage comparator.

21. A pulse-width modulation circuit comprising an oscillator stage and a ramping stage,
the oscillator stage including:
a first voltage comparator having a first input terminal, a second input terminal and an output terminal;
a first capacitor coupled to the first input terminal of the first voltage comparator;
a charging path coupled between the first capacitor and the output terminal of the first voltage comparator, the charging path having a first resistance; and
a discharging path coupled between the first capacitor and the output terminal of the first voltage comparator, the discharging path having a second resistance that is different from the first resistance; and
the ramping stage including a second capacitor coupled to a voltage source terminal through a fourth resistor and coupled to the output terminal of the first voltage comparator through a second diode, a cathode terminal of the second diode coupled to the output terminal of the first voltage comparator.

* * * * *